United States Patent
Lee et al.

(10) Patent No.: US 7,098,102 B2
(45) Date of Patent: Aug. 29, 2006

(54) SHALLOW TRENCH ISOLATION STRUCTURE AND DYNAMIC RANDOM ACCESS MEMORY, AND FABRICATING METHODS THEREOF

(75) Inventors: Yueh-Chuan Lee, Nantou (TW); Jason Chen, Hsin-Chu Ken (TW)

(73) Assignee: ProMOS Technologies Inc., Hsinchu (TW)

( * ) Notice: Subject to any disclaimer, the term of this patent is extended or adjusted under 35 U.S.C. 154(b) by 128 days.

(21) Appl. No.: 10/605,402

(22) Filed: Sep. 29, 2003

(65) Prior Publication Data

US 2004/0229426 A1 Nov. 18, 2004

(30) Foreign Application Priority Data

May 14, 2003 (TW) ................ 92113044 A

(51) Int. Cl.
*H01L 21/8242* (2006.01)
*H01L 29/94* (2006.01)

(52) U.S. Cl. .............. 438/243; 438/244; 438/246; 438/248; 438/386; 438/387; 438/389; 438/391; 438/424; 257/301; 257/303; 257/306; 257/532

(58) Field of Classification Search ........... 438/243, 438/244, 246, 248, 386, 387, 389, 391, 561, 438/700, FOR. 200, FOR. 430, 424, 433, 438/FOR. 220, 296, 301, 516, 532, E27.048, 438/303, 306, E27.092
See application file for complete search history.

(56) References Cited

U.S. PATENT DOCUMENTS

| | | | | |
|---|---|---|---|---|
| 4,119,996 A * | 10/1978 | Jhabvala | ...................... | 257/334 |
| 4,369,564 A * | 1/1983 | Hiltpold | ...................... | 438/239 |
| 4,569,701 A * | 2/1986 | Oh | ............................ | 438/389 |
| 4,830,975 A * | 5/1989 | Bovaird et al. | ............. | 438/589 |
| 5,521,115 A * | 5/1996 | Park et al. | ................... | 438/243 |
| 5,532,179 A * | 7/1996 | Chang et al. | ............... | 438/270 |
| 5,904,541 A * | 5/1999 | Rho et al. | ................... | 438/433 |
| 6,037,194 A * | 3/2000 | Bronner et al. | ............. | 438/147 |
| 6,037,210 A * | 3/2000 | Leas | .......................... | 438/245 |
| 6,365,945 B1 | 4/2002 | Templeton | .................. | 257/395 |
| 2002/0110984 A1* | 8/2002 | Liou et al. | ................... | 438/259 |

* cited by examiner

*Primary Examiner*—George R. Fourson
*Assistant Examiner*—Joannie Adelle Garcia
(74) *Attorney, Agent, or Firm*—Jianq Chyun IP Office

(57) ABSTRACT

A method for fabricating a shallow trench isolation (STI) structure is described. A patterned mask layer is formed on a substrate. An ion implantation is performed to form a doped region in a predetermined depth in the substrate exposed by the mask layer. An etching process is conducted to etch the substrate down to the doped region to form a shallow trench. Thereafter, an isolating material is filled into the shallow trench to form an STI layer. The doped region is located directly under the STI layer, and no doped region is formed in the sidewall of the shallow trench.

16 Claims, 6 Drawing Sheets

SHALLOW TRENCH ISOLATION STRUCTURE AND DYNAMIC RANDOM ACCESS MEMORY, AND FABRICATING METHODS THEREOF

CROSS REFERENCE TO RELATED APPLICATIONS

This application claims the priority benefit of Taiwan application serial no. 92113044, filed May 14, 2003.

BACKGROUND OF INVENTION

1. Field of the Invention

The present invention relates to structures of semiconductor devices and fabricating methods of the same. More particularly, the present invention relates to structures of shallow trench isolation (STI) and dynamic random access memory (DRAM), and fabricating methods of the same.

2. Description of the Related Art

With progressively increased functions of current computer, the memory capacity required in any kind of computer is correspondingly getting larger and larger, and DRAM cells therefore need to be miniaturized continuously for further higher integration. In a deep sub-micron semiconductor process or a more advanced process, the lateral area for forming a DRAM cell and the accompanying storage capacitor is very small, and more sophisticated techniques are required to maintain the surface area of the storage capacitor for its storage capability.

Generally, the storage capacitors formed in DRAM can be divided into two categories according to their structures, namely, stacked capacitor and deep-trench capacitor. No matter which kind of capacitor structure is adopted, DRAM fabrication process gets more and more difficult as device dimensions are being decreased progressively.

On the other hand, in a fabrication process of a semiconductor device such as DRAM, an active area (AA) is usually defined and electrically isolated by forming a shallow trench isolation (STI) structure. When device dimensions are being decreased progressively, enhancing the isolation capability of STI structures is also an important issue.

There have been a variety of methods provided in the prior art for enhancing the isolation capability of STI structures. For example, U.S. Publication No. 2002-0179997 discloses a method that forms a doped region, just after the shallow trench is formed, under the bottom of an STI layer to serve as a channel stop layer, thereby preventing a leakage current between two adjacent active areas.

However, when the doped region is formed under the bottom of an STI layer for enhancing the isolation capability of the STI layer, other leakage problems occur. For example, it is inevitable that some P-type ions are implanted into the sidewall of the shallow trench in the channel stop implantation process to form another doped region therein, since a back-scattering effect may let some ions be implanted into the sidewall of the shallow trench. The doped region in the sidewall of the shallow trench will overlap with the source/drain formed later, so that the junction gradient at the boundary of the source/drain is increased to cause a larger electric field, which further induces a junction leakage.

FIG. 1 illustrates a cross-sectional view of a conventional DRAM cell, which includes a trench capacitor 101 disposed in a substrate 100, an STI layer 122, an active device 136, a buried strap 110 coupling the active device 136 to the trench capacitor 101, an N-doped layer 126 and a P-doped layer 130. The trench capacitor 101 includes a lower electrode 102, an inter-electrode dielectric layer 104, an upper electrode 106 and a collar oxide layer 108 surrounding the upper portion of the upper electrode 106.

The N-doped layer 126 is formed to electrically connect the lower electrodes 102 of all trench capacitors 101 in the memory array (not shown). The P-doped layer 130 is formed in the substrate 100 at a depth just under the bottom of the STI layer 122, also traversing the channel region of a vertical parasitic transistor that consists of the buried strap 110, the lower electrode 102, the collar oxide layer 108 and the upper electrode 106. Therefore, the insulating capability of the STI layer 122 is improved, and the threshold voltage of the parasitic transistor is raised. If the threshold voltage of the parasitic transistor were not raised in this manner, the channel thereof would be turned on easily to cause a leakage of the charges on the capacitor and therefore lower the storage capability. The P-doped layer 130 is usually formed with a P-type ion implantation process after the STI layer 122 is formed.

Moreover, since the P-doped region 130 must be formed at a depth just under the bottom of the STI layer 122 to effectively enhance the isolation capability, the P-doped layer 130 is formed close to the buried strap 110. Therefore, similar to the case mentioned above, the P-N junction gradient at the boundary of the buried strap 110 is increased, and a junction leakage is easily caused thereat.

SUMMARY OF INVENTION

In view of the foregoing, this invention provides a shallow trench isolation (STI) structure and a method for fabricating the same, wherein a doped region is formed under the bottom of the STI layer, and no doped region is formed in the sidewall of the shallow trench.

This invention also provides a DRAM structure and a method for fabricating the same capable of suppressing a leakage in a DRAM cell and improving the reliability of the memory device.

The method for fabricating a STI structure of this invention is described as follows. A patterned mask layer is formed on a substrate exposing a predetermined region for forming an STI layer, and then an ion implantation is performed using the mask layer as a mask to form a doped region in a predetermined depth within the substrate exposed by the mask layer. An etching process is then conducted using the mask layer as a mask to etch the substrate down to the doped region and form a shallow trench. An insulating material is filled into the shallow trench, and then the mask layer is removed to complete the STI process.

The STI structure of this invention includes an STI layer and a doped region. The STI layer is disposed in a substrate, and the doped region is disposed in the substrate just under the bottom of the STI layer. Particularly, no doped region is formed in the sidewall of the shallow trench.

The method for fabricating a DRAM of this invention is described as follows. A trench capacitor is formed in a substrate, including a lower electrode, an inter-electrode dielectric layer and an upper electrode, and a buried strap is formed in the substrate connecting with the upper portion of the upper electrode. A patterned mask layer is formed on the substrate exposing a predetermined region for forming an STI layer, and then an ion implantation is performed using the mask layer as a mask to form a doped region of a first conductivity type in a predetermined depth within the substrate exposed by the mask layer. An etching process is then conducted using the mask layer as a mask to etch the substrate down to the doped region and form a shallow trench. An insulating material is filled into the shallow trench, and then the mask layer is removed. Thereafter, a screen oxide layer is formed on the surface of the substrate, and then an ion implantation is performed to form a first doped layer of a second conductivity type in the substrate that electrically connects with the lower electrode of the trench capacitor. Another ion implantation process is conducted to form a second doped layer of the first conductivity type in the substrate at a depth between the doped region and the first doped layer. The screen oxide layer is removed, and an active device is formed on the substrate coupling with the trench capacitor via the buried strap.

The DRAM structure of this invention includes a trench capacitor, a buried strap, an STI layer, a doped region of a first conductivity type, a first doped layer of a second conductivity type, a second doped layer of the first conductivity type and an active device. The trench capacitor is disposed in a substrate, having a lower electrode, an inter-electrode dielectric layer and an upper electrode, and the buried strap is located in the substrate connecting with the upper portion of the upper electrode. The STI layer is disposed in the substrate and has a portion encroaching upon the trench capacitor. The doped region of the first conductivity type is located in the substrate directly under the STI layer, the first doped layer in the substrate electrically connects with the lower electrode of the trench capacitor, and the second doped layer in the substrate is disposed at a depth between the doped region and the first doped layer. The active device is disposed on the substrate coupling with the trench capacitor via the buried strap.

As mentioned above, the method for fabricating a STI structure of this invention comprises, firstly, forming a doped region in a predetermined depth in the substrate as a channel stop layer, and then etching the substrate down to the doped region to form a shallow trench. Therefore, no implanted dopant exists in the sidewall of the shallow trench, and the P-N junction gradient at the boundary of the source/drain is not increased to cause junction leakage.

Moreover, since the doped region can serve as a detection end point in the etching process of the shallow trench, this invention has a better control over the depth of the shallow trench to improve the wafer to wafer trench depth uniformity.

In addition, since the doped region as a channel stop layer is formed only under the bottom of the STI layer and no implanted dopant exist in the sidewall of the shallow trench in the DRAM cell of this invention, the P-N junction gradient at the boundary of the source/drain is not increased to cause a leakage of the charges on the storage capacitor.

Furthermore, since a doped region as a channel stop layer has been formed under the bottom of the STI layer, the second doped layer of the first conductivity type, e.g., a P-doped layer, can be formed in the substrate deeper than the doped region to be more distant from the buried strap. Therefore, the dopant concentration of the second doped layer can be increased as desired to raise the threshold voltage of the parasitic transistor as high as possible without increasing the P-N junction gradient to cause a leakage.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
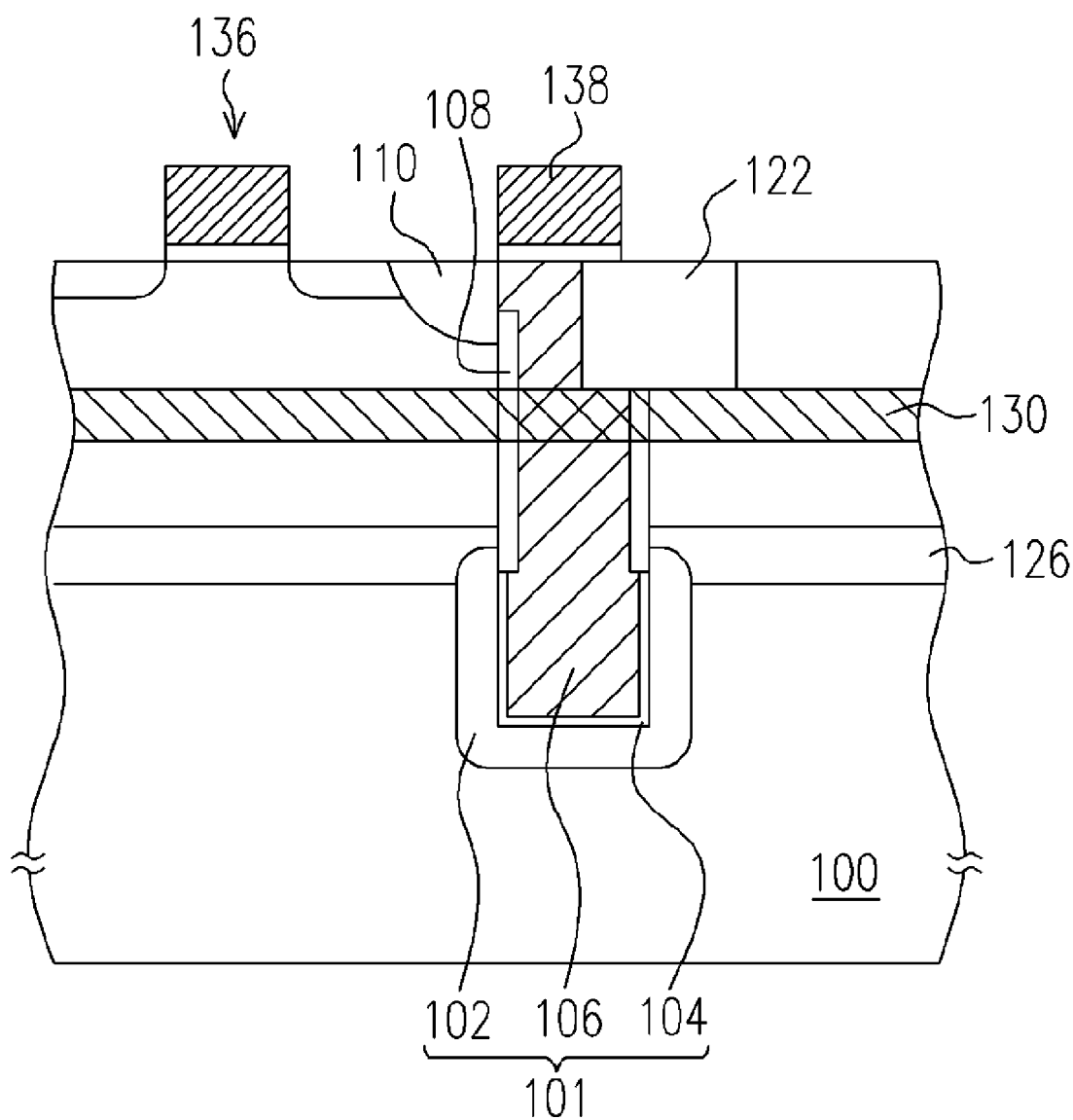
FIG. 1 illustrates a cross-sectional view of a conventional DRAM cell.
Figure 2A:
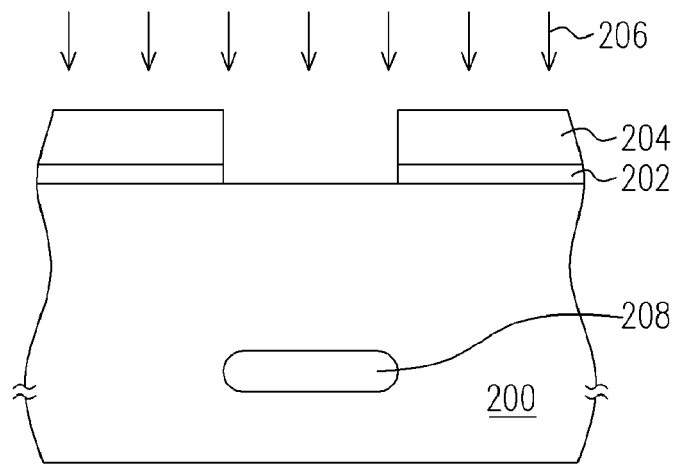
FIGS. 2A–2C illustrate a process flow of fabricating a STI structure according to a preferred embodiment of this invention in a cross-sectional view.
Figure 2B:
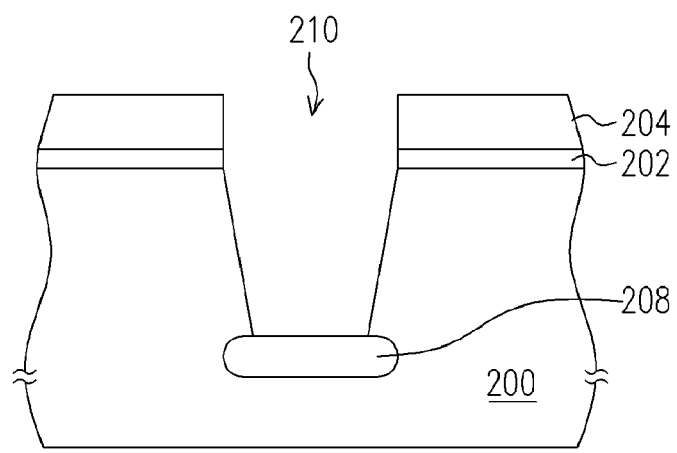
Figure 2C:
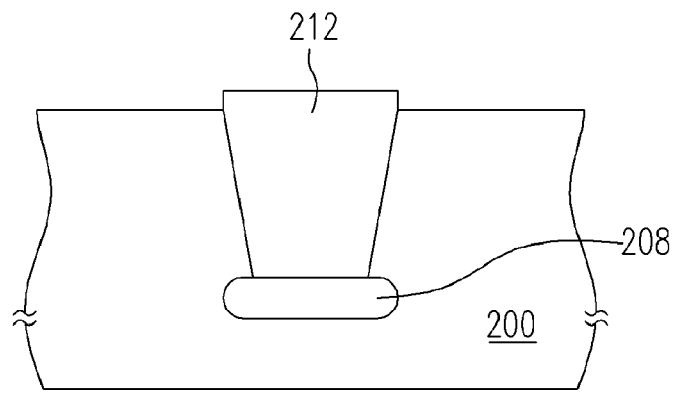

FIGS. 2A–2C illustrate a process flow of fabricating a STI structure according to the preferred embodiment of this invention in a cross-sectional view. At first, a patterned mask layer 204 is formed over a substrate 200 with a pad oxide layer 202 interposed between them for protecting the surface of the substrate 200. The mask layer 204 has a thickness larger than 600 Å, for example, and can be a silicon nitride layer, a stacked silicon nitride/photoresist layer or a stacked silicon nitride/silicon oxide/photoresist layer as required. The patterned pad oxide layer 202 and the patterned mask layer 204 are formed by, for example, sequentially forming a blanket oxide layer, a mask material layer and a patterned photoresist layer (not shown) on the substrate 200, and then etching the mask material layer and the blanket oxide layer using the patterned photoresist layer as a mask. If the photoresist layer is not removed after the etching step, it serves as a part of the patterned mask layer 204 mentioned above.

Thereafter, an ion implantation 206 is performed using the patterned mask layer 204 as a mask to form a doped region 208 in a predetermined depth within the substrate 200 exposed by the mask layer 204. The implanting energy of the ion implantation 206 is adjusted according to the depth of the shallow trench that will be formed later. For example, when an STI layer of 2900 Å in thickness is to be formed in a 0.11 □m process and boron ion is used in the implantation process, the implanting energy of boron ions is adjusted to around 100 KeV. In addition, the dopant in the doped region 208 can be a P-type dopant like boron or an N-type dopant, but has a conductivity type different from that of the active device formed later to serve as a channel stop layer.

Referring to FIG. 2B, an etching process is performed using the mask layer 204 as a mask for etching the substrate 200 down to the doped region to form a shallow trench 210. The doped region 208 can serve as a detection end point of the etching process. Specifically speaking, when the dopants in the doped region are detected in the etching process, the etching process may be terminated according to the end point detection signal. Since the depth of the doped region 208 can be controlled precisely, the depth variation of the shallow trenches 210 between different wafers can be minimized to improve the wafer to wafer trench depth uniformity.

Referring to FIG. 2C, an insulating layer 212 is filled into the shallow trench 210, and then the mask layer 204 and the pad oxide layer 202 are removed to complete the STI process. The insulating layer 212 can be filled into the shallow trench 210 by, for example, blanket depositing an insulating material layer (not shown) over the substrate 200 covering the mask layer 204 and filling up the shallow trench 210, and then conducting a chemical mechanical polishing (CMP) process to polish the insulating material layer until the mask layer 204 is exposed.

Therefore, as shown in FIG. 2C, the STI structure of this invention is constituted of an STI layer 212 and a doped region 208. The STI layer 212 is disposed in a substrate 200, and the doped region 208 is located in the substrate 200 directly under the bottom of the STI layer 212. Particularly, no doped region is formed in the sidewall or the upper edge of the shallow trench 210.

The aforementioned STI structure can be applied to many kinds of semiconductor devices, such as DRAM. A DRAM structure having the STI structure and a fabricating method of the same are described below.

FIGS. 3A–3G illustrate a process flow of fabricating a DRAM cell according to the preferred embodiment of this invention in a cross-sectional view. A substrate 100, such as a P-type substrate, is provided, and then a trench capacitor 101 is formed in the substrate 100, including a doped region 102 as a lower electrode, an inter-electrode dielectric layer 104, a conductive layer 106 as an upper electrode and a collar oxide layer 108.

The trench capacitor 101 can be formed using the following steps. A deep trench, in which the conductive layer 106 will be formed later, is formed in the substrate 100, and then a doped region 102 is formed in the substrate 100 around the lower portion of the deep trench to serve as a lower electrode of the trench capacitor. An inter-electrode dielectric layer 104 is formed on the sidewall of the lower portion of the deep trench, and a collar oxide layer 108 is formed on the sidewall of the upper portion of the deep trench. Then, a conductive layer 106 is filled into the deep trench. Since some steps mentioned above are performed under high temperature conditions, the dopants in the conductive layer 106 diffuse into the substrate 100 from the interface not interposed by the collar oxide layer 108 to form a doped region 110, i.e., the buried strap 110.

After the fabrication of the trench capacitor 101 is completed, a patterned mask layer 302 is formed on the substrate 100 exposing a portion of the substrate 100 predetermined for forming a STI structure. In a preferred embodiment, the thickness of the mask layer 302 is larger than 600 Å, and the mask layer 302 can be a silicon nitride layer, a stacked silicon nitride/photoresist layer or a stacked silicon nitride/silicon oxide/photoresist layer as required.

Figure 3A:
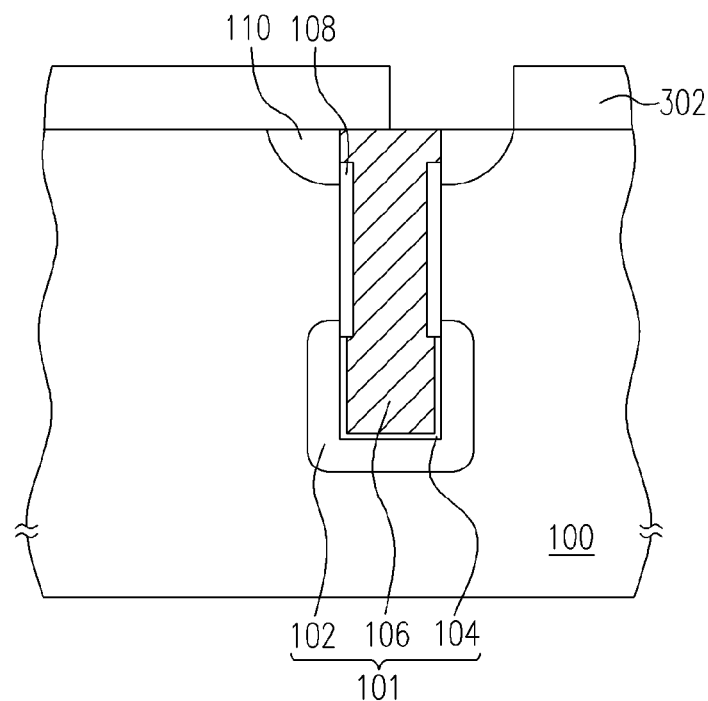
FIGS. 3A–3G illustrate a process flow of fabricating a DRAM cell according to a preferred embodiment of this invention in a cross-sectional view.
Figure 3B:
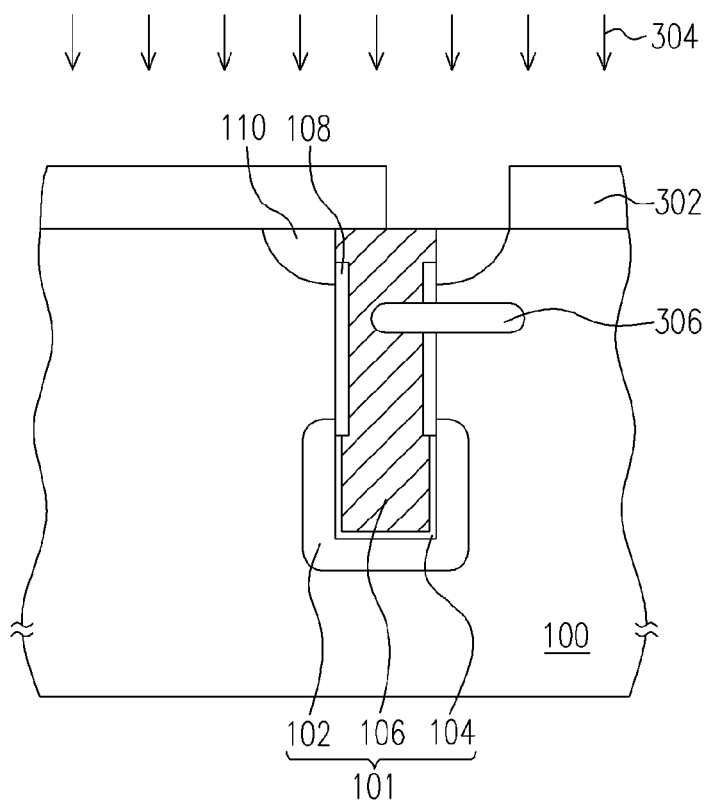

Referring to FIG. 3B, an ion implantation 304 is performed using the patterned mask layer 302 as a mask to form a doped region 306 in a predetermined depth in the substrate 100 exposed by the mask layer 302. The implanting energy of the ion implantation 304 is adjusted according to the depth of the shallow trench that will be formed later. For example, when an STI layer of 2900 Å in thickness is to be formed in a 0.11 □nm process and boron ion is used in the implantation process, the implanting energy of boron ions is adjusted to around 100 KeV. In addition, the dopant in the doped region 306 can be a P-type dopant like boron or an N-type dopant, but has a conductivity type different from that of the active device formed later to serve as a channel stop layer.

Figure 3C:
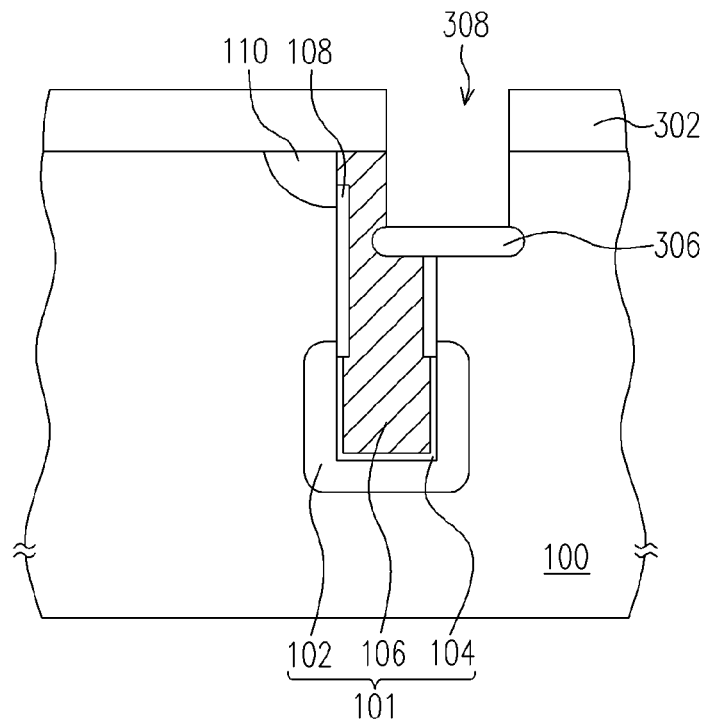

Referring to FIG. 3C, an etching process is performed using the mask layer 302 as a mask to form a shallow trench 308 down to the doped region 306 in the substrate 100. The shallow trench 308 encroaches upon a portion of the buried strap 110 and a top portion of the trench capacitor 101. The doped region 306 can serve as a detection end point of the etching process. Specifically speaking, when the dopants in the doped region 306 are detected in the etching process, the etching process may be terminated according to the end point detection signal. Since the depth of the doped region 306 can be controlled precisely, the depth variation of the shallow trenches 308 between different wafers can be minimized to improve the wafer to wafer trench depth uniformity.

Figure 3D:
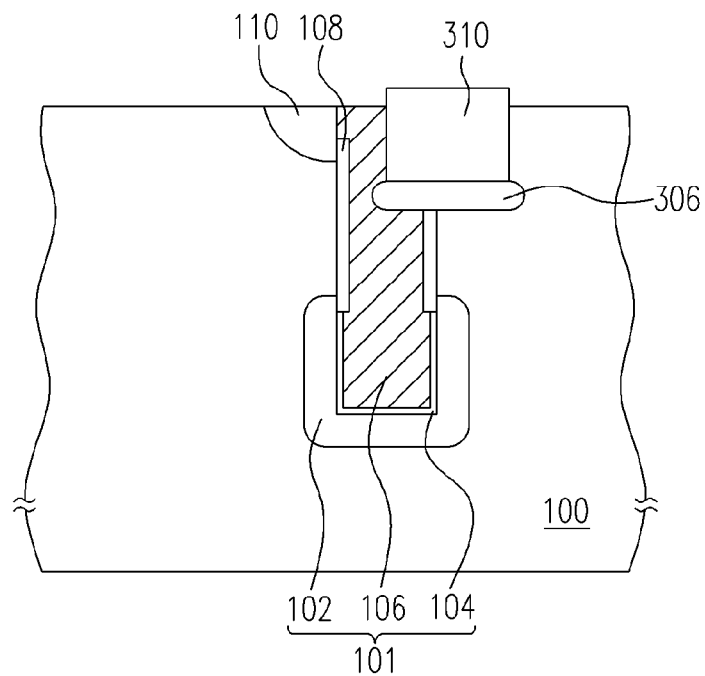

Referring to FIG. 3D, an insulating layer 310 is filled into the shallow trench 308, and then the mask layer 302 is removed to complete the STI process. In a preferred embodiment, the insulating layer 310 can be filled into the shallow trench 308 by, for example, blanket depositing an insulating material layer (not shown) over the substrate 100 covering the mask layer 302 and filling up the shallow trench 308, and then conducting a chemical mechanical polishing (CMP) process to polish the insulating material layer until the mask layer 302 is exposed.

Figure 3E:
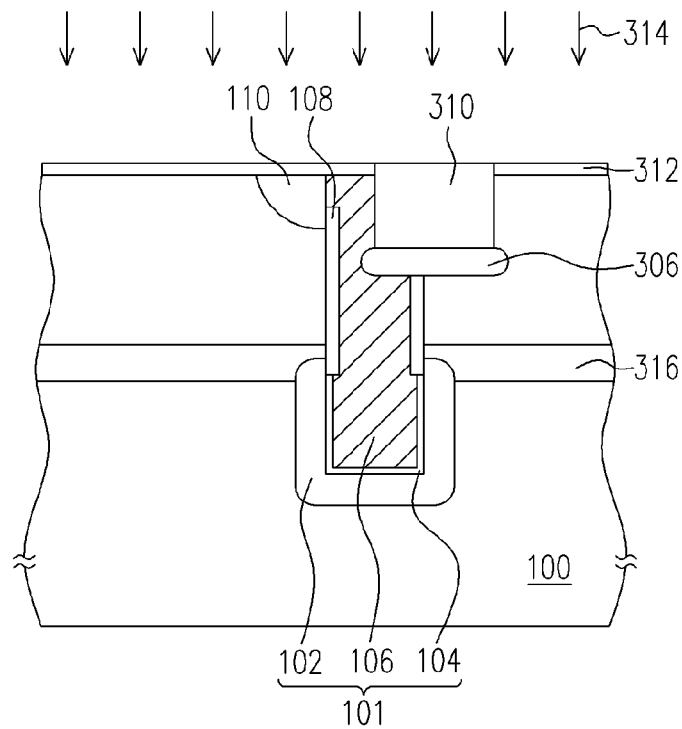

Referring to FIG. 3E, a screen oxide layer 312 is formed on the surface of the substrate 100 to prevent a channel effect in the subsequent ion implantation processes. An ion implantation 314 is conducted to form an N-doped layer 316 in the substrate 100 that electrically connects with the lower electrode 102 (doped region 102) of the trench capacitor 101. In fact, the N-doped layer 316 electrically connects with the lower electrodes of all trench capacitors in the memory array (not shown) to form a common electrode.

Figure 3F:
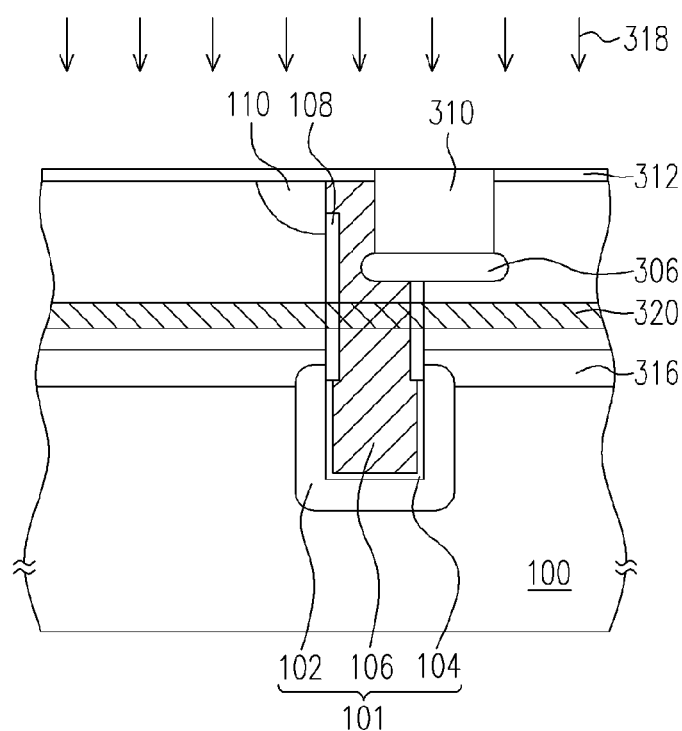

Referring to FIG. 3F, another ion implantation 318 is performed to form a P-doped layer 320 in the substrate 100 at a depth between the doped region 306 and the N-doped layer 316.

The P-doped layer 320 is formed to raise the threshold voltage of the vertical parasitic transistor that is constituted of the buried strap 110, the lower electrode 102, the collar oxide layer 108 and the upper electrode 106. If the threshold voltage of the parasitic transistor were not raised in this manner, the channel thereof would be turned on easily to cause a leakage of the charges on the trench capacitor 101 and therefore lower the storage capability. Moreover, since the doped region 306 as a channel stop layer has been formed under the bottom of the STI layer 310, the P-doped layer 320 can be formed in the substrate 100 deeper than the doped region 306 to be more distant from the buried strap 110. Therefore, the P-N junction gradient at the boundary of the buried strap 110 is not increased, and the junction leakage current can be suppressed. Furthermore, the dopant concentration of the P-doped layer 320 can be increased as required to further raise the threshold voltage and suppress the leakage of the vertical parasitic transistor more effectively.

Figure 3G:
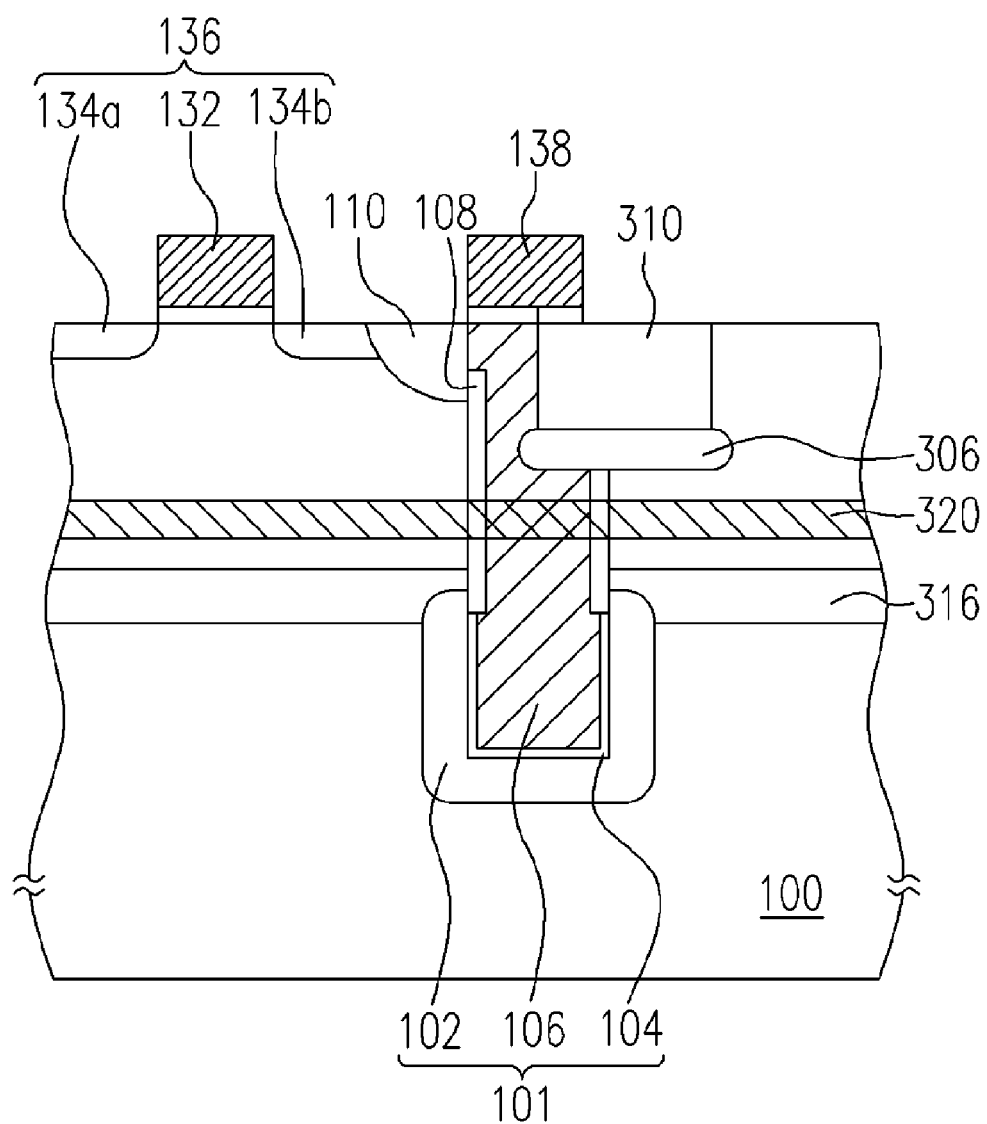

Referring to FIG. 3G, the screen oxide layer 312 is removed after the above ion implantation processes. An active device 136 and a passing word line 138 are formed on the substrate 100, wherein the active device 136 includes a word line 132 and a source/drain 134a/134b, and is coupled to the buried strap 110 that electrically connects with the trench capacitor 101. That is, the active device 136 is coupled to the trench capacitor 101 via the buried strap 110.

Accordingly, as shown in FIG. 3G, the DRAM cell of this embodiment includes a trench capacitor 101, a buried strap 110, an STI layer 310, a P-doped region 306, a P-doped layer 320, an N-doped layer 316 and an active device 136. The trench capacitor 101 is disposed in the substrate 100, including a lower electrode 102, an interelectrode dielectric layer 104 and an upper electrode 106. The buried strap 110 is located in the substrate 100 connecting with the top portion of the trench capacitor 101.

The STI layer 310 is disposed in the substrate 100, and has a portion encroaching upon the top portion of the trench capacitor 101. The P-doped region 306 is located in the substrate 100 directly under the STI layer 310.

The N-doped layer 316 is disposed in the substrate 100 electrically connecting with the lower electrode 102 of the trench capacitor 101. The P-doped layer 320 is disposed in the substrate 100 at a depth between the N-doped layer 316 and the P-doped region 306.

The active device 136 is disposed on the substrate 100, including a word line 132 and a source/drain 134a/134b. The active device 136 is coupled to the buried strap 110 that electrically connects with the trench capacitor 101. That is, the active device 136 is coupled to the trench capacitor 101 via the buried strap 110.

As mentioned above, the method for fabricating a STI structure of this invention comprises, firstly forming a doped region in a predetermined depth in the substrate as a channel stop layer, and then etching the substrate down to the doped region to form a shallow trench. Therefore, no implanted dopant exists in the sidewall of the shallow trench, and the P-N junction gradient at the boundary of the source/drain is not increased to cause a junction leakage.

Moreover, since the doped region can serve as an endpoint indicator in the etching process of the shallow trench, this invention provides a better control over the depth of the shallow trench to improve the wafer to wafer trench depth uniformity.

In addition, since the doped region as a channel stop layer is formed only under the bottom of the STI layer and no implanted dopant exists in the sidewall of the shallow trench in the DRAM cell of this invention, the P-N junction gradient at the boundary of the source/drain is not increased to cause a leakage of the charges on the storage capacitor.

Furthermore, since the doped region serving as a channel stop layer has been formed under the bottom of the STI layer, the second doped layer of the first conductivity type, e.g., a P-doped layer in the preferred embodiment, can be formed in the substrate deeper than the doped region to be more distant from the buried strap. Therefore, the dopant concentration of the second doped layer can be increased as desired to raise the threshold voltage of the parasitic transistor as high as possible without increasing the P-N junction gradient to cause a leakage.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A method for fabricating a shallow trench isolation (STI) structure that defines an active area, comprising:
    forming a patterned mask layer on a substrate;
    forming a doped region in the substrate exposed by the mask layer;
    forming a shallow trench down to the doped region in the substrate after the doped region is formed, wherein the shallow trench is formed by using the patterned mask layer as an etching mask and the doped region serves as a detection end point of the etching process; and
    filling an insulating material into the shallow trench.

2. The method of claim 1, wherein the step of forming the doped region comprises performing an ion implantation using the mask layer as a mask.

3. The method of claim 1, wherein a conductivity type of the doped region is different from a conductivity type of an active device subsequently formed on the active area.

4. The method of claim 1, wherein a conductivity type of the doped region is P-type or N-type.

5. A method for fabricating a dynamic random access memory (DRAM) cell, comprising:
    forming a trench capacitor in a substrate;
    forming a buried strap in the substrate connecting with an upper portion of the trench capacitor;
    forming a patterned mask layer on the substrate;
    performing an ion implantation to form a doped region of a first conductivity type in the substrate exposed by the mask layer;
    performing an etching process to etch the substrate down to the doped region to form a shallow trench;
    filling an isolating material into the shallow trench;
    removing the mask layer;
    forming a first doped layer of the first conductivity type in the substrate, wherein the first doped layer is formed at a depth lower than that of the doped region; and
    forming an active device on the substrate, the active device being coupled to the trench capacitor via the buried strap.

6. The method of claim 5, further comprising forming a second doped layer of a second conductivity type in the substrate electrically connected with a lower electrode of the trench capacitor, the second doped layer being formed at a depth between the doped region and the first doped layer.

7. The method of claim 5, wherein the doped region of the first conductivity type serves as a detection end point of the etching process.

8. The method of claim 5, wherein the first conductivity type is different from a conductivity type of the active device.

9. The method of claim 8, wherein the first conductivity type is P-type.

10. The method of claim 5, wherein a thickness of the mask layer is larger than 600 Å.

11. The method of claim 5, further comprising forming a screen oxide layer on a surface of the substrate after the mask layer is removed.

12. A dynamic random access memory (DRAM) cell, comprising:
    a trench capacitor in a substrate, including a lower electrode, an inter-electrode dielectric layer and an upper electrode;
    a shallow trench isolation layer in the substrate, having a portion encroaching upon the trench capacitor;
    a doped region of a first conductivity type in the substrate directly under a bottom of the shallow trench isolation layer;
    a first doped layer of the first conductivity type in the substrate lower than the doped region; and
    an active device on the substrate coupled to the trench capacitor.

13. The DRAM cell of claim 12, wherein the first conductivity type is different from a conductivity type of the active device.

14. The DRAM of claim 12, further comprising a second doped layer of a second conductivity type in the substrate electrically connected with the lower electrode of the trench capacitor.

15. The DRAM of claim 14, wherein the first doped layer is disposed at a depth between the doped region and the second doped layer.

16. The DRAM of claim 12, further comprising a buried strap in the substrate connected with an upper portion of the upper electrode of the trench capacitor, the buried strap coupling the trench capacitor to the active device.

* * * * *